(12) United States Patent
Binder et al.

(10) Patent No.: US 8,926,757 B2
(45) Date of Patent: Jan. 6, 2015

(54) PLASMA PROCESS AND REACTOR FOR TREATING METALLIC PIECES

(75) Inventors: Roberto Binder, Joinville (BR); Aloisio Nelmo Klein, Joinville (BR); Cristiano Binder, Florianopolis (BR); Gisele Hammes, Florianopolis (BR)

(73) Assignee: Whirlpool S. A., San Pablo (BR)

( * ) Notice: Subject to any disclaimer, the term of this patent is extended or adjusted under 35 U.S.C. 154(b) by 840 days.

(21) Appl. No.: 12/737,125

(22) PCT Filed: Jun. 9, 2009

(86) PCT No.: PCT/BR2009/000165
§ 371 (c)(1),
(2), (4) Date: Jan. 18, 2011

(87) PCT Pub. No.: WO2009/149526
PCT Pub. Date: Dec. 17, 2009

(65) Prior Publication Data
US 2011/0108059 A1    May 12, 2011

(30) Foreign Application Priority Data
Jun. 11, 2008  (BR) ................. PI0803774-4

(51) Int. Cl.
| | |
|---|---|
| B08B 5/00 | (2006.01) |
| B08B 7/04 | (2006.01) |
| C23F 17/00 | (2006.01) |
| C23G 5/00 | (2006.01) |
| C23F 1/00 | (2006.01) |
| H01J 37/32 | (2006.01) |

(52) U.S. Cl.
CPC ....... *H01J 37/32623* (2013.01); *H01J 37/3244* (2013.01); *H01J 37/32522* (2013.01); *B22F 2998/00* (2013.01)
USPC .................... 134/1.1; 134/2; 134/19; 216/67; 216/75

(58) Field of Classification Search
USPC ........................................... 134/1, 1.1, 2, 19
See application file for complete search history.

(56) References Cited

U.S. PATENT DOCUMENTS

| | | | |
|---|---|---|---|
| 6,024,105 A | 2/2000 | Hanazaki et al. | 134/1.3 |
| 6,326,597 B1 * | 12/2001 | Lubomirsky et al. | 219/494 |
| 6,579,493 B1 * | 6/2003 | Klein et al. | 419/36 |

FOREIGN PATENT DOCUMENTS

| | | |
|---|---|---|
| BR | PI 010 5593-3 B1 | 2/2009 |
| EP | 0 881 662 A1 | 12/1998 |
| WO | WO 2006/012718 A1 | 2/2006 |

OTHER PUBLICATIONS

Santos, M.A., et al., "Debinding of injected parts using an abnormal glow discharge", © 2005 Elsevier B.V., 6 pgs.
Machado, R., et al., "Plasma Assisted Debinding and Sinering (PADS)—Metal Injection Molding Application", © 2006 Trans Tech Publications, Switzerland, 7 pgs.

* cited by examiner

*Primary Examiner* — Nicole Blan
*Assistant Examiner* — Natasha Campbell
(74) *Attorney, Agent, or Firm* — Harrington & Smith

(57) ABSTRACT

The plasma reactor defines a reaction chamber provided with a support for the metallic pieces and an anode-cathode system, and a heating means is mounted externally to said plasma reactor. The plasma process, for a cleaning operation, includes the steps of connecting the support to the grounded anode and the cathode to a negative potential of a power source; feeding an ionizable gaseous charge into the reaction chamber and heating the latter at vaporization temperatures of piece contaminants; applying an electrical discharge to the cathode; and providing the exhaustion of the gaseous charge and contaminants. A subsequent heat treatment includes the steps of: inverting the energization polarity of the anode-cathode system; feeding a new gaseous charge to the reaction chamber and maintaining it heated; applying an electrical discharge to the cathode; and exhausting the gaseous charge from the reaction chamber.

10 Claims, 2 Drawing Sheets

PLASMA PROCESS AND REACTOR FOR TREATING METALLIC PIECES

FIELD OF THE INVENTION

The present invention refers to a plasma process and reactor for the treatment of metallic pieces, particularly porous metallic pieces obtained by powder metallurgy, said treatment comprising a cleaning operation with dissociation and removal of oil and other organic and inorganic contaminants existing on the surface or in the pores of metallic pieces, and generally also an operation of thermochemically treating the surface of said metallic pieces, which operations are effected in a plasma reactive environment and, preferably, in the interior of the same reactor.

BACKGROUND OF THE INVENTION

In most of the cases, the pieces produced by powder metallurgy need to be calibrated after the sintering step due to the dimensional variations that occur during sintering. Lubricant oil is used in the calibration to reduce friction and wear of the machine tools, as well as to facilitate extraction of the pieces from the calibration matrix. Oil is likewise used for storing sintered pieces and pieces produced by other manufacturing technique. For example, refrigerant oil is used for machining high precision pieces.

Aiming at improving the properties of the finished pieces, such as wear resistance, corrosion resistance and fatigue resistance, there are often used surface thermochemical treatments, such as nitration, cementation, carbonitration, etc. In order to effect these thermochemical treatments, the presence of oil on the surface and in the pores of the pieces is prejudicial, especially when the thermochemical processing is effected via plasma. For example, during plasma nitration, the oil retained in the pores and on the surface of the pieces produces instabilities in the electrical discharge, contamination of the reactor, inadequate formation of the superficial layers formed (for example, nitrates) and contamination with carbon of the material submitted to treatment by means of an inefficient cleaning. Thus, the oil must be completely removed before the thermochemical treatments of surface hardening.

Conventionally, a chemical cleaning is carried out in ultrasound with organic solvents (for example hexane, petroleum ether or alcohol) further followed by a heat treatment in atmosphere containing hydrogen or oxygen in an industrial electric oven, aiming at eliminating completely all the organic residues from the pieces. When communicating residual pores are present, which generally occurs in sintered steels, the cleaning is especially difficult, besides being pollutant due to the pollutant products used.

In some known treating methods, the operations of cleaning and thermochemically treating the surfaces are carried out in two separate steps in distinct equipment, which requires a very long processing time, typically 20 hours, leading to low productivity and high cost.

With the purpose of obtaining a complete removal of the oil and other organic and inorganic contaminants from the surface or pores of the metallic pieces, and also simplifying and abbreviating a subsequent surface thermochemical treatment operation of said pieces in the same thermal cycle, there has been proposed the process of cleaning and surface treatment object of Brazilian patent application PI-0105593-3, of the same applicant, according to which the pieces to be cleaned are positioned on a support provided inside the plasma reactor and connected to an anode of the latter, the cathode of said reactor being connected to a negative potential. The assembly defined by the support and pieces is surrounded by an ionized gas at low pressure and containing ions, neutral atoms and electrons, known as plasma and which is generated by an abnormal electrical discharge. The electrons provoke an electronic bombardment on the assembly defined by the support and pieces and connected to the reactor anode.

The generation of gaseous plasma in the interior of the reactor allows the plasma reactive environment formed around the pieces to be used to catalyze the reaction of dissociating the molecules of the oil and of other possible contaminants existing in the pieces, allowing the vaporization of said contaminants and the complete elimination thereof through exhaustion, under vacuum, from the inside of the reactor. The heat generated by the plasma, by the collision of fast ions and neutral atoms against the cathode, is usually sufficient to provide vaporization of the molecularly dissociated oil, without requiring relevant changes in the plasma parameters more adequate to catalyze the reactions of interest in each cleaning operation.

However, in plasma reactors of certain dimensions (and in certain chemical reactions of molecular dissociation of the contaminants), it may occur that different inner regions of the reactor remain at a temperature which is sufficiently low to allow condensation of the contaminant vapors prior to the dissociation and progressive deposition thereof in these relatively cold inner regions of the plasma reactor, contaminating the system with carbon-based compounds that are harmful to the subsequent surface treatments.

Moreover, in many surface thermochemical treatment operations occurring subsequently to the cleaning operation and carried out inside the same reactor, the heat generated by the plasma is not enough to maintain the heating rate and the process temperature required to obtain the desired surface treatment.

Thus, even if the surface treatment operation has been executed, as disclosed in said prior patent application, by reverting the electrical circuit between the anode and the cathode, and also by surrounding the pieces with gaseous plasma of ions with high kinetic energy, and by applying an electrical discharge to the cathode so as to provoke an ionic bombardment on the pieces, there is a need to adjust the plasma parameters, not as a function of the reactions of interest, but aiming to obtain temperature levels inside the plasma reactor that are sufficient and necessary for the desired surface treatment. In this case, the temperature variations required inside the reactor are obtained as a function of the electrical discharge parameters, but some situations may exist in which the intensity of the electrical discharge required for the production of determined temperatures leads to the formation of electrical arcs in the reaction environment, causing superficial damages (marks on the pieces) and contamination by carbon deposits on the surfaces of the pieces, impairing the subsequent thermochemical treatments, besides the fact that the thermal gradient negatively influences the formation and homogeneity of the formed layer.

The provision of a resistive heating in plasma reactors is known in the art.

In one of these known reactors, there is provided an external resistive heating for removing the binders and possible contaminants from the pieces obtained by sintering. However, in this known construction, the pieces to be submitted to a treatment for removing binders and contaminants are applied to the reactor cathode, leading to the formation of electric arcs and consequent contamination of the pieces with carbon, which is harmful to the subsequent surface treatments.

In another known type of reactor disclosed in patent U.S. Pat. No. 6,579,493, there is provided an inner resistive heating to obtain high temperatures sufficient to remove the binders and certain contaminants from the metallic pieces obtained by powder metallurgy and also to provide sintering of the pieces. Nevertheless, the provision of resistive heating in the interior of this type of reactor requires the use of high cost materials, such as molybdenum and the provision of heat radiation reflecting elements between the inner resistance and the reactor wall, and also the provision of cooling in said outer wall. This solution is inadequate for cleaning the organic contaminants from the pieces under treatment, since it allows the volatile vapors of oils and other contaminants to be condensed and deposited on the cold regions of the heat radiation reflecting elements and on the reactor wall, before they are exhausted from the reaction environment, contaminating the latter and the pieces contained therein with carbon-based compounds that impair the subsequent surface thermochemical treatments of the pieces.

From the above, there is a need for the provision of a solution which allows obtaining, in the interior of the reactor, homogeneous and even high temperatures as a function of the desired surface treatment, in a way that is independent from the electrical discharge parameters that are more adequate for catalyzing the reactions of interest in each case.

SUMMARY OF THE INVETNION

Thus, it is an object of the present invention to provide a plasma process and reactor for treating metallic pieces by means of gaseous plasma and at temperatures that are generated and controlled in a way totally independent from the plasma generation parameters.

It is another object of the present invention to provide a plasma process and reactor, as mentioned above and which allow the plasma generation parameters to be maintained in levels that are sufficient and adequate for catalyzing the reactions of interest, without leading to the formation of electrical arcs in the reaction environment.

It is a further object of the present invention to provide a plasma process and reactor, as mentioned above and which allow a cleaning operation to be carried out through molecular dissociation through gaseous plasma and through vaporization and exhaustion of the dissociated contaminants, by maintaining the interior of the plasma reactor at temperatures higher than those of condensation of said contaminants.

It is also another object of the present invention to provide a plasma process and reactor, as mentioned above and which allow the operation of thermochemically treating the surface of the metallic pieces to be carried out, also by gaseous plasma, in the same reactor in which the cleaning operation is effected and at temperatures that are obtained and controlled by preferably resistive heating.

These and other objects are attained through a plasma process for treating metallic pieces in a plasma reactor defining a reaction chamber provided with: a support; an anode-cathode system associated with an electrical power source; an ionizable gaseous charge inlet; and a gaseous charge exhaustion outlet connected to a vacuum system.

The plasma process for treating metallic pieces of the present invention comprises the following cleaning steps: a) connecting the support to the grounded anode and the cathode to a negative potential of the electric power source; b) positioning the metallic pieces on the support in the interior of the reaction chamber; c) surrounding the support and the metallic pieces with an ionizable gaseous charge fed into the reaction chamber; d) heating the interior of the reaction chamber, from the outer side of the plasma reactor, at vaporization temperatures of contaminants to be dissociated from the metallic pieces being treated in the interior of the reaction chamber; e) applying an electrical discharge to the cathode, in order to provoke the formation of a gaseous plasma of ions with high kinetic energy surrounding the metallic pieces and the support, and a bombardment of electrons in the metallic pieces for molecular dissociation of the contaminants; e f) providing the exhaustion of the gaseous charge and of the contaminants maintained in gaseous state, from the interior of the reaction chamber. In the cases in which the metallic pieces are submitted, after cleaning, to a thermochemical treatment, the plasma process for treating metallic pieces of the present invention comprises, after step "f" of the cleaning operation, the further steps of thermochemically treating the surface of the metallic pieces, in the same reactor, said steps comprising: g—inverting the energization polarity of the anode-cathode system, so that the support, with the metallic pieces, defines the cathode; h—surrounding the support and the metallic pieces with a new ionizable charge fed into the reaction chamber; i—maintaining the interior of the reaction chamber heated, from the outer side of the plasma reactor, and conducting the temperature therein to the levels required in the desired surface thermochemical treatment; j—applying an electrical discharge to the cathode, so as to provoke the formation of a gaseous plasma of ions surrounding the metallic pieces and the support, as well as an ionic bombardment in the metallic pieces; and k—providing the exhaustion of the gaseous charge from the interior of the reaction chamber.

The present invention also presents a plasma reactor for treating metallic pieces and in which the process steps described above are carried out, said reactor presenting a metallic casing defining, internally, a reaction chamber, as already described, and a heating means mounted externally to the metallic casing, in order to heat the latter and the interior of the reaction chamber. According to one aspect of the present invention, the heating means is formed by at least one resistor in thermal contact with the metallic casing.

According to a particular aspect of the present invention, the support comprises multiple parallel and spaced apart ordering structures which are electrically coupled to the same electrode of the anode-cathode system and intercalated by conducting elements coupled to the other electrode of the anode-cathode system, each of said ordering structures carrying at least one metallic piece to be treated. In a preferred construction, the metallic casing portions, producing heat radiation to the inside of the reaction chamber, are disposed according to a direction orthogonal to the mounting direction of the ordering structures.

Even in the cases in which the surface treating operations to be effected inside the reactor require temperatures that are not so high as those required in sintering operations and which reach values of about 1100° C., the positioning of the heating means externally to the metallic casing of the reactor allows the latter to present a simpler and cleaner inner construction, avoiding the formation of intermediary regions, between the heating means and said casing, which are susceptible to the capture and subsequent deposition of contaminants.

BRIEF DESCRIPTION OF THE DRAWINGS

The invention will be described below, with reference to the attached drawings, given by way of example of embodiments of the invention and in which.

DESCRIPTION OF THE INVENTION

Figure 1:
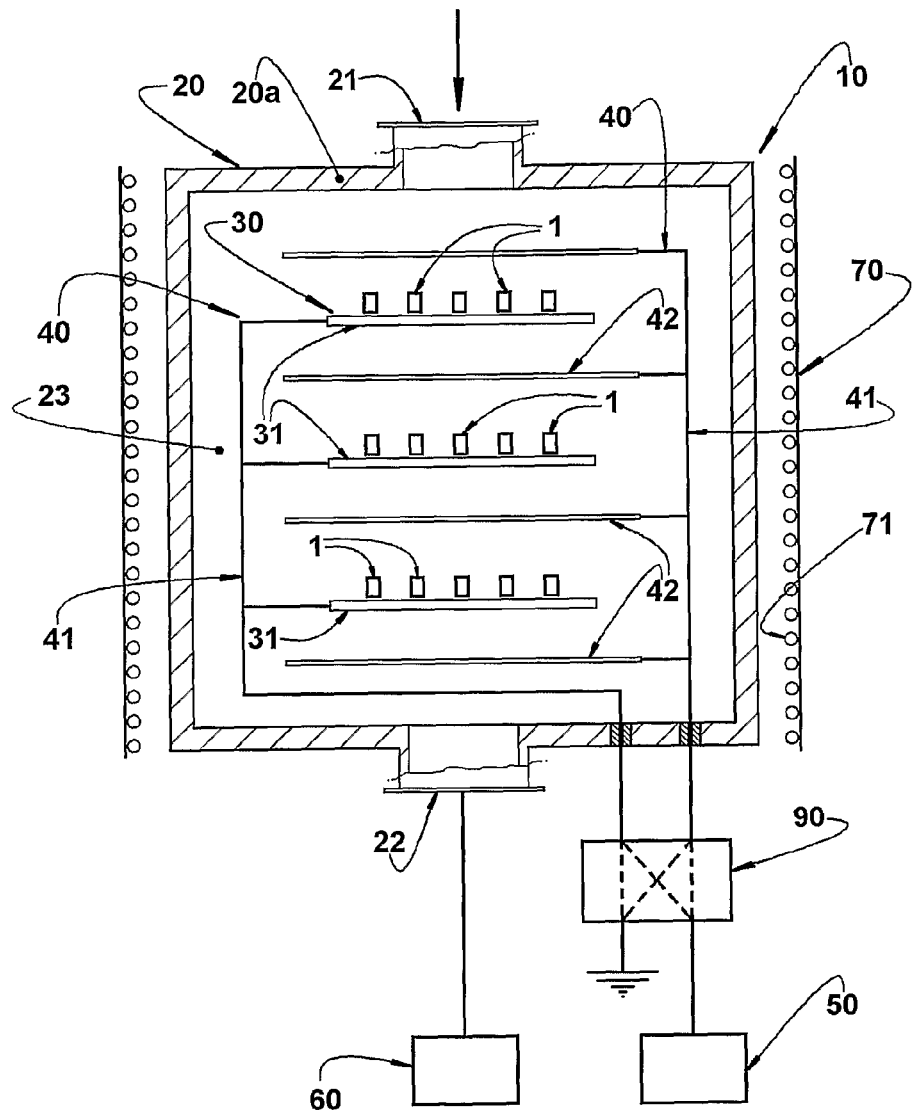
FIG. 1 represents, schematically, a plasma reactor constructed according to the present invention, illustrating some metallic pieces provided on a support mounted in the interior of said plasma reactor.
Figure 2:
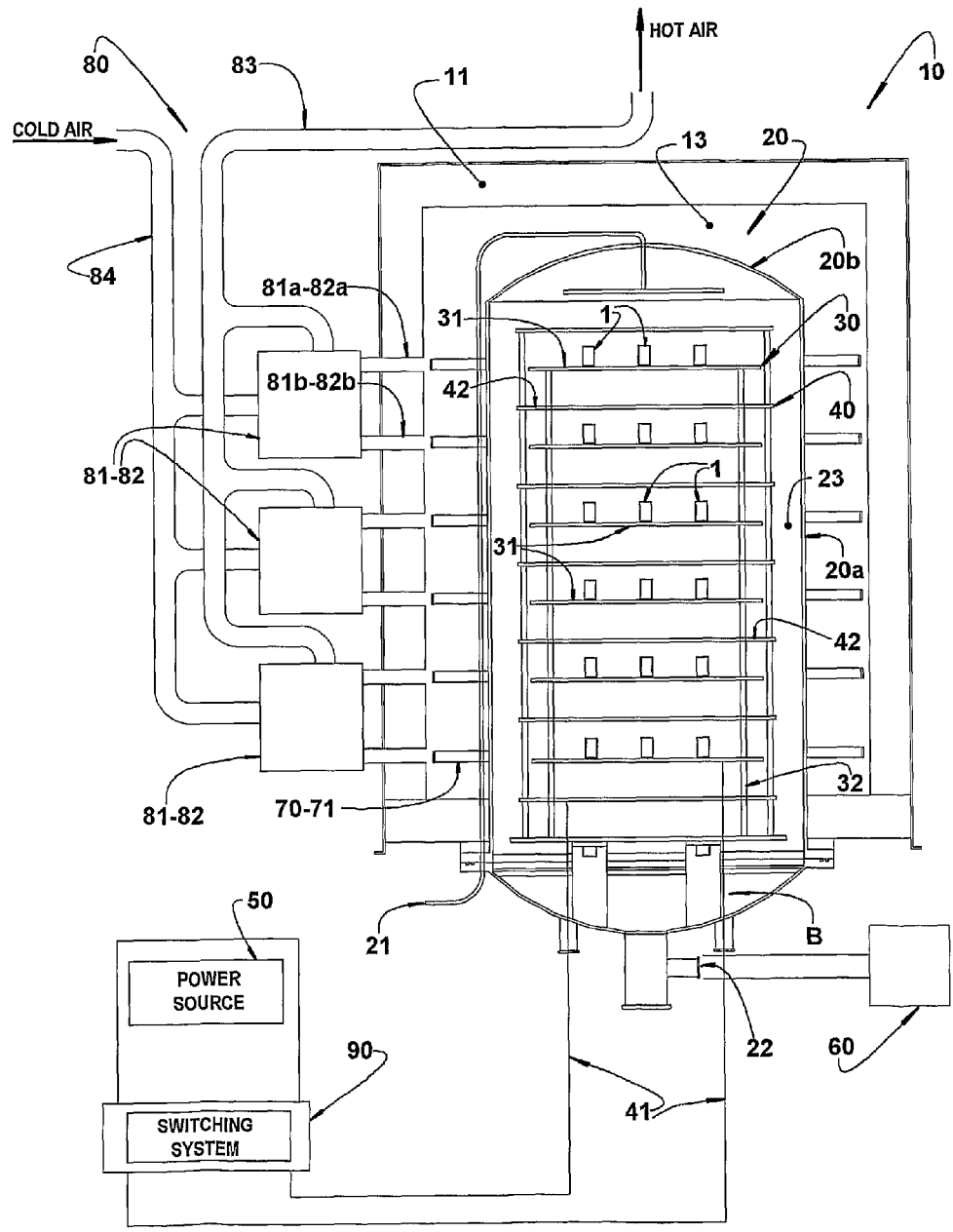
FIG. 2 represents a simplified and rather schematic vertical section view of a plasma reactor constructed according to the present invention and housing, inside the reaction chamber, a piece support comprising a plurality of horizontal ordering structures.

As mentioned above and as illustrated in the appended drawings, the invention relates to a plasma process and reactor for treating metallic pieces 1, said process being carried out in a plasma reactor 10 comprising a metallic casing 20, having an ionizable gaseous charge inlet 21e and a gaseous charge exhaustion outlet 22, said metallic casing 20 defining, internally, a reaction chamber 23 inside which is usually positioned a support and an anode-cathode system 40, associated with an electric power source 50 external to the metallic casing 20. A reaction chamber 23 is coupled to a vacuum system 60 connected to the outlet 22 of the metallic casing 20. The reaction chamber 23 is maintained hermetic for plasma generation therewithin, the inlet 21 is hermetically coupled to an ionizable gas supply source (not illustrated) and the outlet 22 is hermetically coupled to the vacuum system 60.

The metallic casing 20 is preferably formed in refractory steel (as, for example stainless steel AISI 310 or 309) and the support 30 in refractory steel (as, for example stainless steel AISI 310 or 309), but other type of material can be used, depending on the adequate process temperatures.

The metallic casing 20 presents a prismatic shape, for example, a cylinder, having wall extensions 20a which, in the cylindrical shape, comprises a surrounding side wall and an upper end wall 20b.

The metallic casing 20 is inferiorly open so as to be removably and hermetically seated and locked on a base structure B to which are adequately mounted component parts operatively associated with the reactor and which will be described ahead.

The plasma reactor 10 of the present invention further comprises a heating means 70 mounted externally to the plasma reactor 10, that is, to its metallic casing 20, in order to heat the latter and the interior of the reaction chamber 23, for example, producing heat radiation from the metallic casing 20 to the interior of the reaction chamber 23.

The plasma reactor 10 is also externally provided with an outer cover 11, generally made of carbon steel coated with an adequate heat insulating means (aluminade and silicade fibers, for example) presenting an adequate shape so as to surround laterally and superiorly the assembly defined by the metallic casing 20 and by the heating means 70, defining a heating chamber 13 around the metallic casing 20 and inside which is positioned the heating means 70.

The heating means 70 is generally formed by at least one resistor 71 mounted in thermal contact with the metallic casing 20, inside the heating chamber 13 defined between the metallic casing 20 and the outer cover 11. According to a way of carrying out the present invention, it is further provided a ventilation system 80 comprising at least one air circulating means 81 generally positioned external to the outer cover 11 and provided with at least one suction nozzle 81a and at least one discharge nozzle 81b that are opened to the interior of the heating chamber 13, said air circulating means 81 being able to produce a circulating airflow in at least part of the interior of the heating chamber 13 and through the suction and discharge nozzles 81a, 81b. In case the air circulating means 81 is mounted externally to the heating chamber 13, the suction and discharge nozzles 81a, 81b take the form of tubular extensions opened to the interior of the heating chamber 13.

The ventilation system 80 can further comprise at least one air exchanging means 82, generally with a construction similar to that of the air circulating means 81 and also positioned externally to the outer cover 11. The air exchanging means 82 is provided with at least one suction nozzle 82a and at least one discharge nozzle 82b opened to the interior of the heating chamber 13, said air exchanging means 82 being also connected to an air admission duct 83, generally opened to the atmosphere, and to an air exhaustion duct 84, generally opened to the atmosphere. The air exchanging means 82 can be constructed in any adequate manner known in the art so as to provide a controlled supply of atmospheric air to the interior of at least one respective region of the heating chamber 13, while it extracts and expels to the atmosphere, through the air exhaustion duct 84, a corresponding amount of heated air removed from at least one respective inner region of the heating chamber 13, allowing effecting a certain heating degree of the inner regions of the heating chamber 13.

The intensity of the air circulation or air exchange within the heating chamber 13 can be achieved by different ways, such as, for example, by varying the operational speed of a ventilating means, not illustrated, or by varying the positioning of the inner deflecting means, also not illustrated.

In the illustrated embodiment, there are provided multiple air circulating means 81 which also perform the function of air exchanging means 82, said means being constructed with ventilating and deflecting means adequately controlled to allow performing any one of the functions of air circulation and air exchange mentioned above.

In the construction illustrated in the attached drawings, the reaction chamber 23 is provided, superiorly, with an inlet 21 positioned in the vertical axis of the metallic casing 20 of the plasma reactor 10, in order to homogenously distribute the ionizable gaseous charge from said inlet 21. In this construction, the support 30 is formed by a plurality of ordering structures 31 that are horizontally or substantially horizontally disposed, thus defining piece support or mounting planes that are orthogonal to the direction in which the gaseous charge is fed through the inlet 21, said ordering structures 31 having through openings to allow the gaseous charge to reach the pieces mounted in the ordering structures 31 that are more distant from the inlet 21.

The ionizable gaseous charge is admitted to and exhausted from the reaction chamber 23 by command of control valves, not illustrated, which are automatically driven, for example, commanded by a control unit or other specific control means (not illustrated), but said control valves can be manually driven. While not illustrated either, the switching of the anode-cathode system can be carried out automatically or not, it being observed that these means for controlling the valves and the anode-cathode system are particular aspects that do not restrict the concept presented herein.

In the embodiment illustrated and as mentioned above, the support 30 comprises multiple parallel and spaced apart ordering structures 31 electrically coupled to the same electrode 41 of the anode-cathode system 40 and which are interposed by conducting elements 42 coupled to the other electrode 41 of the anode-cathode system 40, each of said ordering structures 31 carrying at least one metallic piece 1 to be treated.

The conducting elements 42 coupled to the other electrode 41 are positioned in the interior of the reaction chamber 23, between the ordering structures 31, by using any adequate support structure that can be defined by structural columnar elements 32 of the support 30 itself that carries the ordering structures 31, it being only necessary to mount said conducting elements 42 electrically insulated in relation to the structure of the support 30 provided with the respective ordering structures 31.

According to the present invention and as exemplarily illustrated, the heating means 70 is arranged so as to heat adjacent wall extensions of said metallic casing 20 and extending according to a direction, usually that coinciding with the direction of the height of the reaction chamber 23 and which is orthogonal to the mounting planes of the ordering structures 31. With this arrangement, the heat radiated from said wall extensions of the metallic casing 20 to the interior of the reaction chamber 23 follows a direction parallel to the mounting direction of the ordering structures 31, making more efficient the distribution, among the ordering structures 31, of the heat radiated from said wall extensions of the metallic casing 20.

The anode-cathode system 40 has its electrodes 41 defined by the anode and cathode of said energizing system. During the cleaning operation of the plasma process of the invention, the electrode 41, which defines the anode of the anode-cathode system 40, is coupled to the ordering structures 31 of the support 30, in which the metallic pieces 1 are positioned, said electrode 41 being grounded, whereas the other electrode 41 which defines the cathode of the anode-cathode system is electrically coupled to the electric power source 50.

In the plasma processes in which after the cleaning operation there is effected, in the same reactor, processes of thermochemical treatment, the electrode 41, which defined the anode of the anode-cathode system, is coupled to the power source 50, whereas the other electrode 41 is grounded.

As described below, the present invention allows performing the cleaning and the thermochemical treatment (for example, nitration, carbonitration, cementation, oxynitration, oxycarbonitration and others), in which both steps are aided by plasma, in the same equipment and in the same thermal cycle and in which the anode-cathode system is confined in the interior of the reaction chamber 23 in order to allow plasma generation and consequently utilize plasma reactive environment to catalyze the reaction of dissociating the contaminant molecules found in the metallic pieces 1, such as oil organic molecules in the cleaning operation.

During the cleaning operation, the metallic casing 20 is heated jointly with the gaseous charge, which is also submitted to a certain heating degree inside the reaction chamber 23 upon plasma generation. The formation of the gaseous plasma of ions contributes to the heating of the interior of the reaction chamber 23 and to the vaporization of the contaminants being dissociated, both in the cleaning operation and in the thermochemical treating operation.

Besides contributing to the vaporization of contaminants in the interior of the reaction chamber 23, the external heating of the latter allows the gaseous plasma formed therewithin to be obtained with less energy consumption. The resistive heating, provided externally to the reaction chamber 23, avoids the existence of cold walls in the interior of the latter, that is, in the environment in which the metallic pieces 1 are subject to the plasma treating process. It is necessary to avoid the existence of cold walls in the interior of the reaction chamber 23, for example, in the initial phase of heating the metallic pieces 1, since the oil evaporated from the pieces being treated tends to deposit on the not sufficiently heated inner regions of the reaction chamber 23.

Thus, the additional and generally resistive external heating avoids the existence of walls or regions of the reaction chamber 23 presenting temperatures lower than those of vaporization of the contaminants, that is, of the vaporized oil, impeding the condensation and deposition of contaminants in these cooler regions of the reaction chamber 23, before said contaminants are exhausted, by suction, through the vacuum system 60, through the outlet 22 of the metallic casing 20.

For the cleaning operation, the metallic pieces 1 to be processed are positioned on the ordering structures 31 of the support 30 mounted inside the reaction chamber 23, electrically insulated from its metallic casing 20. During the cleaning operation, the support 30 defines the anode of the anode-cathode system 40, which anode is grounded, whereas the conducting elements 42 are connected to an outlet of the electric power source 50, in negative potential, acting as the cathode of the electrical discharge. The interior of the reaction chamber 23 is maintained at a sub-atmospheric pressure and with desired values for the formation of plasma in the cleaning operation, by using the vacuum system 60. A charge of ionizable gases is fed into the reaction chamber 23, through inlet 21 of the metallic casing 20, before providing the electrical discharge in the cathode of the anode-cathode system 40.

In a way of carrying out the present invention, the ionizable gaseous charge, in the cleaning operation, comprises hydrogen, and it can also comprise a gaseous mixture containing hydrogen and at least one of the gases consisting of argon, nitrogen, or a mixture comprising oxygen and other gases, as for example, nitrogen. The selection of the process gases will depend on the nature of the substance to be eliminated from the metallic piece (for example, oil).

For example, the gaseous charge will comprise:
hydrogen, when the contaminants to be removed from the metallic pieces present reactivity with hydrogen, or are based on hydrocarbon chains that are dissociated in gases based on carbon and hydrogen (methane ($CH_4$), for example);
oxygen, when the contaminants to be removed from the metallic pieces present reactivity with oxygen, or are based on hydrocarbon chains that are dissociated in gases based on carbon and oxygen (carbon dioxide ($CO2$), for example);
mixtures of argon and hydrogen or oxygen, when a higher electron density is desired for dissociating the contaminants to be removed from the metallic pieces; and
mixtures of nitrogen and argon or hydrogen or oxygen, when the contaminants to be removed from the metallic pieces have their dissociation facilitated by the mixture of said gases.

The dissociation of other contaminant bases is also possible with the principle of the present invention.

The main principle of the cleaning operation consists in dissociating the oil molecules by electron bombardment, resulting in lighter molecules or gaseous radicals which are eliminated from the reaction chamber 23 by exhausting the gaseous charge and contaminants from the inside thereof. In a way of carrying out the present invention, the exhaustion occurs under vacuum, via bombardment through the vacuum system 60, producing an efficient cleaning of the pieces, as well as maintaining the interior of the reaction chamber 23 deprived of oil deposits and other contaminant products, mainly the organic ones, the cleaning operation being effected at low temperatures, in the range of from about 30° C. to 500° C., depending on the nature of the contaminants to be eliminated.

In such embodiment, the support 30 and the metallic pieces 1 to be treated are surrounded by the plasma generated with the electrical discharge and bombarded mainly by electrons generated in the plasma. The second electrode 41, which in the cleaning step receives the electrical discharge and actuates as the cathode, is bombarded mainly by ions and consequently heated. As the heat produced in the cathode warms the metallic pieces 1, for the cleaning operation, the heating means 70, external to the reaction chamber 23, supplies the additional amount of heat necessary to obtain the heating rate and temperature required to avoid condensation of the contaminants on the inner walls of the reaction chamber 23, said heating rate and temperature being programmed independently of the plasma parameters. These plasma parameters are adjusted or programmed so as to catalyze the reaction of dissociating the molecules of the contaminant, such as for example, oil. As already mentioned, the formation of gaseous plasma can also contribute with part of the heating of the interior of the reaction chamber 23 required to avoid condensation of contaminants on the inner walls of the reaction chamber 23.

The use of a heating means 70, external to the reaction chamber 23, presents the advantage of allowing a homogeneous temperature to be obtained in the interior of the reaction chamber 23, as well as avoiding the deposition of vapors and soot resulting from the plasma reaction in the metallic pieces 1 inside the plasma reactor 10. Another advantage, resulting from the geometry used in the confined anode-cathode system 40 is that the species generated in the plasma surround, completely, the metallic pieces 1, leading to an efficient removal of the contaminants, such as oil, from the metallic pieces 1.

The dissociation of the oil molecules produces lighter radicals and molecules, which maintain the gaseous physical state at the working temperature and are pumped outwardly from the plasma reactor 10 through the vacuum system 60.

The contaminant vapor is discharged from the reaction chamber 23 jointly with the other gases produced in the plasma operation, upon completion of the cleaning operation of the metallic pieces 1. Since there are no residues inside the reaction chamber 23, because the oil and other contaminants are completely eliminated by the molecular dissociation activated by the active species generated in the plasma, the load of metallic pieces 1 can be treated inside the same plasma reactor 10, upon completion of the cleaning operation of said metallic pieces 1, by raising the temperature in the interior of the reaction chamber 23 to values compatible with those required in a determined thermochemical treatment.

In the solution of the present invention, the plasma reactor 20 further comprises a switching system 90, which allows inverting the polarity between the anode and the cathode of the anode-cathode system 40, so that the metallic pieces 1, which during the cleaning operation with dissociation of oil and contaminants are necessarily connected to the anode, are connected to the cathode of the anode-cathode system 40 for the thermochemical treatment by plasma.

With the present invention, the cleaning and thermochemical treatment operations carried out by plasma occur in the same plasma reactor, with no need of interrupting the heating.

After the cleaning operation, with the removal of contaminants, particularly oil, the thermochemical treatment operation is started in the same plasma reactor 10, by introducing, through the inlet 21 of the metallic casing 20, a charge of ionizable gases into the interior of the reaction chamber 23, which can be similar to the one used in the cleaning operation or contain determined specific gases for the desired thermochemical treatment, said new ionizable gaseous charge being fed to the interior of the reaction chamber 23, so as to surround the support 30 and the metallic pieces 1.

The ionizable gases of the thermochemical treatment operation are fed into the interior of the reaction chamber 23, after exhausting the gases and vapors of the cleaning operation therefrom.

The polarity between the cathode and the anode is then inverted, so that the metallic pieces 1 are connected to the cathode and, upon generation of electrical discharge in a gas mixture specifically defined for a determined thermochemical treatment of the already cleaned metallic pieces, carrying out this treatment in the same plasma reactor 10 and in the same thermal cycle.

It should be noted that the present thermochemical treatment process can present alteration in this sequence of steps of feeding a charge of ionizable gases and of inverting the polarity, without changing the result obtained.

After the admission of a new gaseous charge and the inversion of polarity of the anode-cathode system 40, the thermochemical treatment process further comprises the steps of: maintaining the interior of the reaction chamber 23 heated from the outer side of the plasma reactor 10 and conducting the temperature therewithin to the levels required in the desired surface thermochemical treatment; applying an electrical discharge to the cathode, in order to provoke the formation of a gaseous plasma of ions surrounding the metallic pieces 1 and the support 30, and an ionic bombardment on the metallic pieces 1; and providing the exhaustion of the gaseous charge from the interior of the reaction chamber 23.

In the thermochemical treatment operation, the gaseous charge supplied to the reaction chamber 23 comprises, for example: a gaseous mixture of hydrogen and nitrogen, when the thermochemical treatment is nitration; a gaseous mixture containing hydrogen, nitrogen and carbon, when the surface thermochemical treatment is nitrocarburization or carbonitration; a mixture containing hydrogen, argon and carbon, when the surface treatment is cementation; and a gaseous mixture containing oxygen, hydrogen, nitrogen, argon and carbon, when the surface thermochemical treatment is oxynitration, oxynitrocarburization or oxycarbonitration. Other gases can be used, depending on the desired thermochemical process.

For the thermochemical treatment operation, the support 30 is connected to the negative potential of the electric power source 50, through the electrode 41 which actuates as the cathode of the electrical discharge, whereas the electrode 41 which had the cathode function before is grounded, actuating as the anode of the electrical discharge. After this inversion of polarity, that is, with the metallic pieces 1 on the support 30 connected to the cathode of the electrical discharge, the desired step of thermochemical treatment by plasma is carried out in the same plasma reactor 10 and in the same thermal cycle. The gaseous charge to be ionized in the reaction chamber 23 is submitted and maintained, in each of the cleaning and thermochemical treatment operations, at a sub-atmospheric pressure of the order of $1.33 \times 10^1$ Pascal (0.1 Torr) a $1.33 \times 10^4$ Pascal (100 Torr), which pressures are obtained by action of the vacuum system 60 comprising, for example, a vacuum pump. The cleaning and heat treatment operations utilize DC electrical discharge, which can be delivered in an atmosphere under low pressure containing an ionizable gas charge, as defined above, so as to produce electrons and reactive atomic hydrogen or other species, depending on the gases utilized for plasma generation.

The process of the present invention, including the cleaning and thermochemical treatment operations by plasma, can be used for metallic pieces 1 produced by powder metallurgy or by other manufacturing processes (for example, machining, stamping, cold extrusion, and others). The process of the present invention promotes a cleaning of the metallic pieces 1 in the plasma reactor 10 of the present invention in a period of time of about 3 hours, with the total time, including the cleaning operation and the thermochemical treatment (for example, nitration) being of about 6 hours. This processing time can be changed, for longer or shorter periods of time, as a function of the nature of the contaminant and of the thermochemical process.

The heating means 70, external to the reaction chamber 23, warms the inner walls of the metallic casing 20, avoiding deposition of contaminants, such as oil drops. It is possible to maintain the plasma stable and to dissociate the whole charge of contaminants from the metallic pieces by the plasma generation, as well as maintain the reaction chamber 23 deprived of oils and soot, allowing to give continuity to the heating and to subsequently carry out the process of thermochemical treatment with the help of plasma in the same plasma reactor. By using the auxiliary resistive heating system and keeping the reaction chamber 23 at about 500° C., there is no occurrence of any type of deposition and soot formation, and the electrical discharge is kept totally stable, allowing the complete removal of contaminants, such as oil, in approximately 3 hours, via molecular dissociation. Both the final temperature and the cleaning time can be alteree as a function of the chemical nature of the contaminant.

After this cleaning step, in which the metallic pieces 1 were connected to the anode, the polarity is inverted and the support 30 of the metallic pieces 1 is connected to the cathode.

After exhaustion of the gases used in the cleaning process, the temperature in the interior of the reaction chamber 23 is raised, for carrying out the process of thermochemical treatment, to values between about 350° C. and about 900° C.

Upon changing the charge of the gaseous mixture to, for example, hydrogen and nitrogen and heating the reaction chamber at temperatures between 480° C. and 590° C., there is effected the plasma nitration, or other thermochemical treatment, in the same plasma reactor 1 and in the same thermal cycle, resulting in the reduction of the total processing time and energy consumption, thus reducing the production cost. Other temperature ranges are possible (temperatures higher or lower than the range cited as an example) and that are defined as a function of the type of thermochemical treatment to be performed.

The metallic pieces 1 were treated in the plasma reactor in an industrial scale, in which the operations of plasma cleaning and thermochemical treatment, such as plasma nitration, were carried out in the same thermal cycle. Said metallic pieces 1 were analyzed by optical and electronic microscopy, as well as by X-ray diffraction analysis. Results show that the nitrated layer obtained is similar to that obtained by a conventional process, that is, not effected in a single thermal cycle and carrying out the cleaning operation by traditional processes with organic solvents and removing heat using other equipment. However, it is important to point out that the total treatment time, when the treatment is made by this novel process using plasma to remove oil, is significantly shorter, resulting in higher productivity. Moreover, the process of removing oil by plasma does not use pollutant reactants such as hexane and others, which are traditionally used in the chemical cleaning process. A further advantage of the present process is related to the use of the confined cathode-anode system 40 which allows smaller distances to be used among the pieces in the support, thereby allowing the provision of a greater amount of pieces in the same volume of the reaction chamber 23 and/or the utilization of equipment with reduced dimensions for the same productivity, as compared to the other known prior art systems. Finally, the use of the same plasma reactor 10 to perform the steps of cleaning (for example, oil removal) and thermochemical treatment (such as nitration), by using the confined cathode-anode system with an external resistive heating, leads to a substantial investment reduction.

While only one way of carrying out the present invention has been illustrated herein, it should be understood that alterations can be made in the form and arrangement of the constitutive elements, without departing from the constructive concept defined in the claims that accompany the present specification.

The invention claimed is:

1. Plasma process for treating metallic pieces, the process comprising using a plasma reactor comprising an outer cover, a metallic casing provided internal to the outer cover with a distance from said outer cover and defining, internally, a reaction chamber provided with: a support; an anode-cathode system associated with an electric power source;

an ionizable gaseous charge inlet; and a gaseous charge exhaustion outlet connected to a vacuum system, wherein the process comprises the following cleaning and thermochemical treatment steps:
  a) connecting the support to the grounded anode and the cathode to a negative potential of the electric power source;
  b) positioning the metallic pieces on the support in the interior of the reaction chamber;
  c) surrounding the support and the metallic pieces with an ionizable gaseous charge superiorly and vertically fed into the reaction chamber through the gaseous charge inlet;
  d) heating the interior of the reaction chamber, from the outer side of the plasma reactor, internally to the outer cover, at vaporization temperatures of the contaminants to be dissociated from the metallic pieces being treated in the interior of the reaction chamber;
  e) applying an electrical discharge to the cathode, in order to provoke the formation of a gaseous plasma of ions with high kinetic energy surrounding the metallic pieces and the support, and a bombardment of electrons on the metallic pieces for molecular dissociation of the contaminants;
  f) providing, by the vacuum system, the exhaustion of the gaseous charge and of the contaminants maintained in gaseous state, from the interior of the reaction chamber;
  g) thermochemically treating the pieces by inverting the energization polarity of the anode-cathode system so that the support, with the metallic pieces, defines the cathode;
  h) surrounding the support and the metallic pieces with a new ionizable gaseous charge that is superiorly and vertically fed into the reaction chamber through the gaseous charge inlet;
  i) maintaining the interior of the reaction chamber heated from the outer side of the plasma reactor and conducting the temperature therein to the levels required in the desired surface thermochemical treatment;
  j) applying an electrical discharge to the cathode, in order to provoke the formation of a gaseous plasma of ions surrounding the metallic pieces and the support, as well as an ionic bombardment on the metallic pieces; and
  k) providing, by the vacuum system, the exhaustion of the gaseous charge from the interior of the reaction chamber.

2. Process, according to claim 1, characterized in that the gaseous charge comprises hydrogen when the contaminants to be removed from the metallic pieces are defined by contaminants presenting reactivity with hydrogen and by hydrocarbon-based contaminants to be dissociated in gases based on carbon and hydrogen.

3. Process, according to claim 1, characterized in that the gaseous charge comprises oxygen when the contaminants to be removed from the metallic pieces are defined by contaminants presenting reactivity with oxygen, and by hydrocarbon-based contaminants to be dissociated in gases based on carbon and oxygen.

4. Process, according to claim 1, characterized in that the gaseous charge comprises mixtures of argon with hydrogen or oxygen when the contaminants to be removed from the metallic pieces require a higher electronic density for the dissociation.

5. Process, according to claim 1, characterized in that the gaseous charge comprises mixtures of nitrogen with argon or hydrogen or oxygen when the contaminants to be removed from the metallic pieces have their dissociation activated by the presence of nitrogen.

6. Process, according to claim 1, characterized in that the gaseous charge comprises a gaseous mixture containing hydrogen and nitrogen, when the surface thermochemical treatment is nitration.

7. Process, according to claim 1, characterized in that the gaseous charge comprises a gaseous mixture containing hydrogen, nitrogen and carbon, when the surface thermochemical treatment is carbonitration or nitrocarburization.

8. Process, according to claim 1, characterized in that the gaseous charge comprises a gaseous mixture containing hydrogen, argon and carbon, when the surface thermochemical treatment is cementation.

9. Process, according to claim 1, characterized in that the gaseous charge comprises a gaseous mixture containing hydrogen, nitrogen, argon, carbon and oxygen, when the surface thermochemical treatment is oxynitration, oxynitrocarburization and oxycarbonitration.

10. A plasma process for treating metallic pieces, the process comprising using a plasma reactor defining a reaction chamber provided with: a support; an anode-cathode system associated with an electric power source; an ionizable gaseous charge inlet; and a gaseous charge exhaustion outlet connected to a vacuum system, wherein the process comprises:
  cleaning the pieces by connecting the support to the grounded anode and the cathode to a negative potential of the electric power source;
  positioning the metallic pieces on the support in the interior of the reaction chamber;
  surrounding the support and the metallic pieces with an ionizable gaseous charge fed into the reaction chamber;
  heating the interior of the reaction chamber to vaporization temperatures of the contaminants to be dissociated from the metallic pieces being treated in the interior of the reaction chamber;
  applying an electrical discharge to the cathode, in order to provoke the formation of a gaseous plasma of ions with high kinetic energy surrounding the metallic pieces and the support, and a bombardment of electrons on the metallic pieces for molecular dissociation of the contaminants;
  providing the exhaustion of the gaseous charge and of the contaminants maintained in gaseous state, from the interior of the reaction chamber;
  thermochemically treating the pieces by inverting the energization polarity of the anode-cathode system so that the support, with the metallic pieces, defines the cathode;
  surrounding the support and the metallic pieces with a new ionizable gaseous charge that is fed into the reaction chamber;
  maintaining the interior of the reaction chamber heated from the outer side of the plasma reactor and conducting the temperature therein to the levels required in the desired surface thermochemical treatment;
  applying an electrical discharge to the cathode, in order to provoke the formation of a gaseous plasma of ions surrounding the metallic pieces and the support, as well as an ionic bombardment on the metallic pieces; and
  providing the exhaustion of the gaseous charge from the interior of the reaction chamber.

* * * * *